United States Patent
Ngwendson et al.

(10) Patent No.: US 12,166,111 B2
(45) Date of Patent: Dec. 10, 2024

(54) REVERSE CONDUCTING IGBT WITH CONTROLLED ANODE INJECTION

(71) Applicants: Dynex Semiconductor Limited, Lincolnshire (GB); Zhuzhou CRRC Times Semiconductor Co. Ltd., Hunan (CN)

(72) Inventors: Luther-King Ekonde Ngwendson, Lincolnshire (GB); Ian Deviny, Lincolnshire (GB)

(73) Assignees: DYNEX SEMICONDUCTOR LIMITED, Lincolnshire (GB); ZHUZHOU CRRC TIMES SEMICONDUCTOR CO. LTD., Hunan (CN)

( * ) Notice: Subject to any disclaimer, the term of this patent is extended or adjusted under 35 U.S.C. 154(b) by 668 days.

(21) Appl. No.: 17/413,196

(22) PCT Filed: Jun. 18, 2020

(86) PCT No.: PCT/EP2020/066900
§ 371 (c)(1),
(2) Date: Jun. 11, 2021

(87) PCT Pub. No.: WO2021/254615
PCT Pub. Date: Dec. 23, 2021

(65) Prior Publication Data
US 2022/0320323 A1  Oct. 6, 2022

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0696* (2013.01); *H01L 29/0834* (2013.01); *H01L 29/407* (2013.01); *H01L 29/66348* (2013.01)

(58) Field of Classification Search
CPC ............ H01L 29/7397; H01L 29/0696; H01L 29/0834; H01L 29/407; H01L 29/66348
(Continued)

(56) References Cited

U.S. PATENT DOCUMENTS 6,639,295 B2   10/2003   Majumdar
7,456,484 B2   11/2008   Ozeki
(Continued)

FOREIGN PATENT DOCUMENTS

JP    2009021557 A    1/2009
JP    2013048230 A    3/2013

OTHER PUBLICATIONS

International Search Report and Written Opinion dated Mar. 17, 2021 for corresponding International Patent Application No. PCT/EP2020/066900.
(Continued)

*Primary Examiner* — Igwe U Anya
(74) *Attorney, Agent, or Firm* — Tarolli, Sundheim, Covell & Tummino LLP

(57) ABSTRACT

We herein describe a semiconductor device comprising a first element portion formed on a substrate, the first element portion being an operating region of an insulated gate bipolar transistor (IGBT) and a second element portion formed on the substrate, the second element portion being an operating region of a diode. The first element portion comprises a first collector region of a second conductivity type, a drift region of a first conductivity type located over the first collector region, and formed by the semiconductor substrate, a first body region of a first conductivity type located over the drift region, a second body region of a second conductivity type located over the drift region, at least one first contact region of a first conductivity type
(Continued)

located above the second body region and having a higher doping concentration compared to the first body region, at least one second contact region of a second conductivity type located laterally adjacent to the at least one first contact region, the at least one second contact region having a higher doping concentration than the second body region, a first plurality of trenches extending from a surface through the second body region of a second conductivity type into the drift region wherein the at least one first contact region adjoins at least one of the plurality of trenches so that, in use, a channel region is formed along said at least one trench of the first plurality of trenches and within the body region of a second conductivity type. A first trench of the first plurality of trenches is laterally spaced from a second trench of the first plurality of trenches by a first distance. The second element portion comprises a second collector region of a second conductivity type, the drift region of a first conductivity type located over the second collector region, a third body region of a second conductivity type located over the drift region, a second plurality of trenches extending from a surface through the third body region into the drift region. A first trench of the second plurality of trenches is laterally spaced from a second trench of the second plurality of trenches by a second distance, and the first distance is larger than the second distance. The semiconductor device further comprises a first terminal contact, wherein the first terminal contact is electrically connected to the at least one first contact region of a first conductivity type and the body region of a second conductivity type and a second terminal contact, wherein the second terminal contact is electrically connected to the first collector region and the second collector region.

17 Claims, 6 Drawing Sheets

(51) Int. Cl.
*H01L 29/08* (2006.01)
*H01L 29/40* (2006.01)
*H01L 29/66* (2006.01)

(58) Field of Classification Search
USPC .......................................................... 257/140
See application file for complete search history.

(56) References Cited

U.S. PATENT DOCUMENTS

| | | |
|---|---|---|
| 7,952,143 B2 | 5/2011 | Soeno |
| 8,168,999 B2 | 5/2012 | Tsuzuki |
| 8,299,496 B2 | 10/2012 | Nagaoka |
| 11,450,762 B2* | 9/2022 | Shirakawa ............ H01L 29/407 |
| 2011/0285427 A1 | 11/2011 | Koyama |
| 2012/0043581 A1* | 2/2012 | Koyama ............. H01L 29/8613 |
| | | 257/140 |
| 2014/0084335 A1 | 3/2014 | Senoo |
| 2016/0141400 A1* | 5/2016 | Takahashi .......... H01L 29/7391 |
| | | 257/140 |
| 2016/0211257 A1 | 7/2016 | Yoshida |
| 2016/0351561 A1 | 12/2016 | Senoo |
| 2017/0025522 A1 | 1/2017 | Naito |
| 2018/0269202 A1* | 9/2018 | Yamano .............. H01L 29/7397 |
| 2018/0350962 A1* | 12/2018 | Naito .................. H01L 21/3225 |
| 2018/0366548 A1* | 12/2018 | Naito .................... H01L 21/266 |
| 2019/0067463 A1 | 2/2019 | Abe |
| 2019/0206860 A1* | 7/2019 | Kamimura ........ H01L 29/66348 |
| 2019/0312029 A1* | 10/2019 | Shirakawa ............ H01L 29/417 |
| 2022/0328669 A1* | 10/2022 | Mitsuzuka .......... H01L 29/4236 |

OTHER PUBLICATIONS

European Official Action dated Aug. 1, 2024 for European Application No. 20733951.6.

* cited by examiner (a)

(b)

(c)

(d)

(e)

REVERSE CONDUCTING IGBT WITH CONTROLLED ANODE INJECTION

RELATED APPLICATIONS

The present application is a U.S. National Stage application under 35 USC 371 of PCT Application Serial No. PCT/EP2020/066900, filed on 18 Jun. 2020; the entirety of which is incorporated herein by reference.

TECHNICAL FIELD

The present disclosure relates to semiconductor devices, particularly but not exclusively, to reverse conducting insulated gate bipolar transistors (RC-IGBTs).

BACKGROUND

In reverse conducting insulated gate bipolar transistors (RC-IGBTs) an IGBT and a diode are integrated in parallel on the same semiconductor chip. Traditional methods, including anode doping, employed to improve the reverse recovery performance of the diode often degrade the IGBT performance.

US 2016/0211257 relates to a semiconductor device having a IGBT portion and a diode portion, where the trenches in the diode portion are narrower than trenches in the IGBT portion.

U.S. Pat. No. 8,299,496 relates to a semiconductor device having a separation region between an IGBT portion and a diode portion.

U.S. Pat. Nos. 8,168,999, 6,639,295, 7,952,143, and 7,456,484 also relate to semiconductor devices having an IGBT cell region and a diode cell region.

SUMMARY

According to an aspect of the present disclosure, there is provided a semiconductor device comprising:
 a first element portion formed on a substrate, the first element portion being an operating region of an insulated gate bipolar transistor (IGBT); and
 a second element portion formed on the substrate, the second element portion being an operating region of a diode,
  wherein the first element portion comprises:
   a first collector region of a second conductivity type;
   a drift region of a first conductivity type located over the first collector region, and formed by the semiconductor substrate;
   a first body region of a first conductivity type located over the drift region;
   a second body region of a second conductivity type located over the drift region;
   at least one first contact region of a first conductivity type located above the second body region and having a higher doping concentration compared to the first body region;
   at least one second contact region of a second conductivity type located laterally adjacent to the at least one first contact region, the at least one second contact region having a higher doping concentration than the second body region;
   a first plurality of trenches extending from a surface through the second body region of a second conductivity type into the drift region wherein the at least one first contact region adjoins at least one of the plurality of trenches so that, in use, a channel region is formed along said at least one trench of the first plurality of trenches and within the body region of a second conductivity type, and wherein a first trench of the first plurality of trenches is laterally spaced from a second trench of the first plurality of trenches by a first distance; and
  wherein the second element portion comprises:
   a second collector region of a second conductivity type;
   the drift region of a first conductivity type located over the second collector region;
   a third body region of a second conductivity type located over the drift region;
   a second plurality of trenches extending from a surface through the third body region into the drift region, wherein a first trench of the second plurality of trenches is laterally spaced from a second trench of the second plurality of trenches by a second distance, and wherein the first distance is larger than the second distance; and
  wherein the semiconductor device further comprises:
   a first terminal contact, wherein the first terminal contact is electrically connected to the at least one first contact region of a first conductivity type and the body region of a second conductivity type; and
   a second terminal contact, wherein the second terminal contact is electrically connected to the first collector region and the second collector region.

Compared to state of the art devices, the presently disclosed device have improved diode reverse recovery performance without degrading IGBT performance. Anode injection of the diode is controlled by increasing the trench cell density in the diode area, relative to the IGBT area.

The first trench of the first plurality of trenches may be an adjacent trench to second trench of the first plurality of trenches. The first trench of the second plurality of trenches may be an adjacent trench to second trench of the second plurality of trenches. In other words, the semiconductor device has a diode and IGBT integrated anti-parallel to each other with closely auxiliary trenches in the diode side of the device.

The first terminal contact may be an emitter contact, and the second terminal contact may be a collector contact.

The first plurality of trenches may be active trenches and the second plurality of trenches may be auxiliary trenches.

The first plurality of trenches may occupy a first fraction of the area of the first element portion, and the second plurality of trenches may occupy a second fraction of the area of the second element portion, and the second fraction may be greater than the first fraction. There is reduced anode injection in the diode area, since the trenches within the diode area take up a larger fraction of the diode area.

The second plurality of trenches may occupy at least 50% of the area of the second element portion. The second plurality of trenches may occupy at least 75% of the area of the second element portion. The second plurality of trenches may occupy between 50% and 75% of the area of the second element portion.

The number density of trenches within the first element portion may be given by m, and the number density of trenches within the second element portion may be given by n, and m may be substantially smaller than n. In other words there is higher trench density in the diode region, than in the IBGT region. The increased trench density allows an enhanced n-well to be formed in the diode area, up to 5× without affecting (breakdown voltage) BV performance. The closeness of trenches in the diode provides electric shielding such that the n-well doping can be enhanced to a greater extent without BV degradation (reduction in BV).

The first distance may be between 2 µm and 4 µm, and the second distance may be less than 2 µm.

The second element portion may comprise a fourth body region of a first conductivity type (or n-well layer) located over the drift region. The fourth body region may be located between the first trench of the second plurality of trenches and the second trench of the second plurality of trenches. In other words, the diode area may have an n-well layer under the p-anode.

The fourth body region may have a higher doping concentration than the second body region. There may be higher doping of the n-well layer under the diode p-anode than the n-well under the p-well in the IGBT portion of the device. The doping of the n-well under the diode p-anode (or emitter contact) can be increased to levels higher than present in the IGBT area. The increased trench cell density (in other words, the closeness of adjacent trenches in the diode area) means that the doped n-well region in the diode side of the device can be enriched without degradation in breakdown performance. Therefore, the combination of high trench density (or closer trenches) and an enhanced n-well layer in the diode side, enables anode injection optimisation of the diode (to achieve lower diode reverse recovery current (Irr), diode reverse recovery charge (Qrr) and diode reverse recovery energy (Erec)) without affecting the RC-IGBT performance. This reduces the requirement for lifetime control of the RC-TIGBT (reverse conducting trench insulated gate bipolar transistor) and helps to maintain good performance of the RC-IGBT.

The doping concentration of the fourth body region may be greater than $5 \times 10^{16}$ cm$^{-3}$. The doping concentration of the fourth body region may be greater than $1 \times 10^{17}$ cm$^{-3}$. The doping concentration may be between $5 \times 10^{16}$ and $3 \times 10^{17}$ cm$^{-3}$.

The semiconductor device may further comprise one or more additional trenches extending from a surface through the first and second collector regions to the drift layer. In other words, the additional trenches are upside down compared to the first and second plurality of trenches, such that the additional trenches extend from the collector contact to the drift layer.

The one or more additional trenches may be located such that the one or more additional trenches are located partially within the first element portion and partially within the second element portion.

The one or more additional trenches may have a depth of between 15 µm and 20 µm.

In other words, the device may have a deep trench having a depth of 15-20 µm on the IGBT collector side. This reduces snap-back in the IGBT characteristics. Snap back is a negative resistance region in the diode I-V characteristics and if present, it can cause oscillations during switching. Therefore reducing snap-back is advantageous. The additional trench may be formed in an IGBT/diode transition region (partly within the first element portion and partly within the second element portion) in the backside of the device, and constrains electrons during IGBT conduction mode to flow only into the P+ region (the first collector region) in the back side to prevent snap-back. This improves design flexibility in an RC-IGBT.

The second element portion may comprises at least one third contact region of a second conductivity type (or p+ contact region). The at least one third contact region may have a higher doping concentration than the third body region. The third contact region may be located between the first trench of the second plurality of trenches and the second trench of the second plurality of trenches.

The first trench of the second plurality of trenches and the second trench of the second plurality of trenches may be laterally spaced in a first dimension (or a horizontal direction or X-direction), and in use, current may flow in the second element portion of the device in a second dimension (or a vertical direction or Y-direction) substantially transverse to the first dimension, and the first trench of the second plurality of trenches and the second trench of the second plurality of trenches may each extend in a third dimension of the device (or Z-direction).

The third contact region may be formed in the third dimension of the device.

The third body region comprises a plurality of portions in the third dimension, wherein the portions are shaped such that at least a space is formed between two portions. The portions may be physically separate or may be a single piece formed of multiple portions, shaped such that a space exists between portions.

The third contact region may comprise a plurality of segments in the third dimension, each segment may be located within the space formed between two portions of the third body region.

In other words, the device may have additional shallow p+ implants (third, highly doped contact regions) distributed between adjacent trenches in the diode area, towards a top surface of the device. The distributed p+ regions tailor the trade-off performance of diode on-state conduction voltage drop (Vf) with diode reverse recovery energy (Erec) and diode reverse recovery current (Irr).

According to a further aspect of the present disclosure, there is provided a method of manufacturing a semiconductor device comprising:

forming a first element portion formed on a substrate, the first element portion being an operating region of an insulated gate bipolar transistor (IGBT); and forming a second element portion formed on the substrate, the second element portion being an operating region of a diode, wherein forming the first element portion comprises:
 forming a first collector region of a second conductivity type;
 forming a drift region of a first conductivity type located over the first collector region, and formed by the semiconductor substrate;
 forming a first body region of a first conductivity type located over the drift region;
 forming a second body region of a second conductivity type located over the drift region;
 forming at least one first contact region of a first conductivity type located above the second body region and having a higher doping concentration compared to the first body region;
 forming at least one second contact region of a second conductivity type located laterally adjacent to the at least one first contact region, the at least one second contact region having a higher doping concentration than the second body region;
 forming a first plurality of trenches extending from a surface through the second body region of a second conductivity type into the drift region wherein the at least one first contact region adjoins at least one of the plurality of trenches so that, in use, a channel region is formed along said at least one trench of the first plurality of trenches and within the body region of a second conductivity type, and wherein a first trench of the first plurality of trenches is laterally spaced from a second trench of the first plurality of trenches by a first distance; and wherein forming the second element portion comprises:
  forming a second collector region of a second conductivity type;
  forming the drift region of a first conductivity type located over the second collector region;
  forming a third body region of a second conductivity type located over the drift region;
  forming a second plurality of trenches extending from a surface through the third body region into the drift region, wherein a first trench of the second plurality of trenches is laterally spaced from a second trench of the second plurality of trenches by a second distance, and wherein the first distance is larger than the second distance; and wherein the method further comprises:
  forming a first terminal contact, wherein the first terminal contact is electrically connected to the at least one first contact region of a first conductivity type and the body region of a second conductivity type; and
  forming a second terminal contact, wherein the second terminal contact is electrically connected to the first collector region and the second collector region.

According to a further aspect of the present disclosure, there is provided a method of manufacturing a semiconductor device having a first element portion formed on a substrate, the first element portion being an operating region of an insulated gate bipolar transistor (IGBT), and a second element portion formed on the substrate, the second element portion being an operating region of a diode, wherein each of the first element portion and the second element portion comprise a body region of a first conductivity type and at least one trench extending from a surface through the first body region, and wherein the body region of a first conductivity type of the second element portion has a higher doping concentration than the body region of a first conductivity type of the first element portion, and wherein the method comprises:
  performing an etching process to the trenches laterally spaced from one another;
  depositing a highly doped region of a first conductivity type in a lower portion of each of the trenches;
  providing a mask over the trench of the first element portion;
  depositing an additional highly doped region of a first conductivity type in a lower portion of trench of the second element portion;
  removing the mask;
  performing an additional etching process to extend the depth of the trenches.

The method allows manufacture of a semiconductor device having a higher doping level in an n-well layer under the diode p-anode than an n-well layer in the IGBT portion of the device. The enhanced n-well layer in the diode portion of the device can be manufactured using the same process as manufacturing the IGBT portion of the device, which includes a buried n-well process using single or multiple high energy n-well implants. Advantageously, the manufacturing process can be used to form the trenches in the IGBT portion and diode portion simultaneously.

The method may further comprise depositing a filling material within the trenches.

BRIEF DESCRIPTION OF THE FIGURES

The present disclosure will be understood more fully, and by way of example only, with reference to the accompanying drawings, in which.

DETAILED DESCRIPTION OF THE PREFERRED EMBODIMENTS

Figure 1:
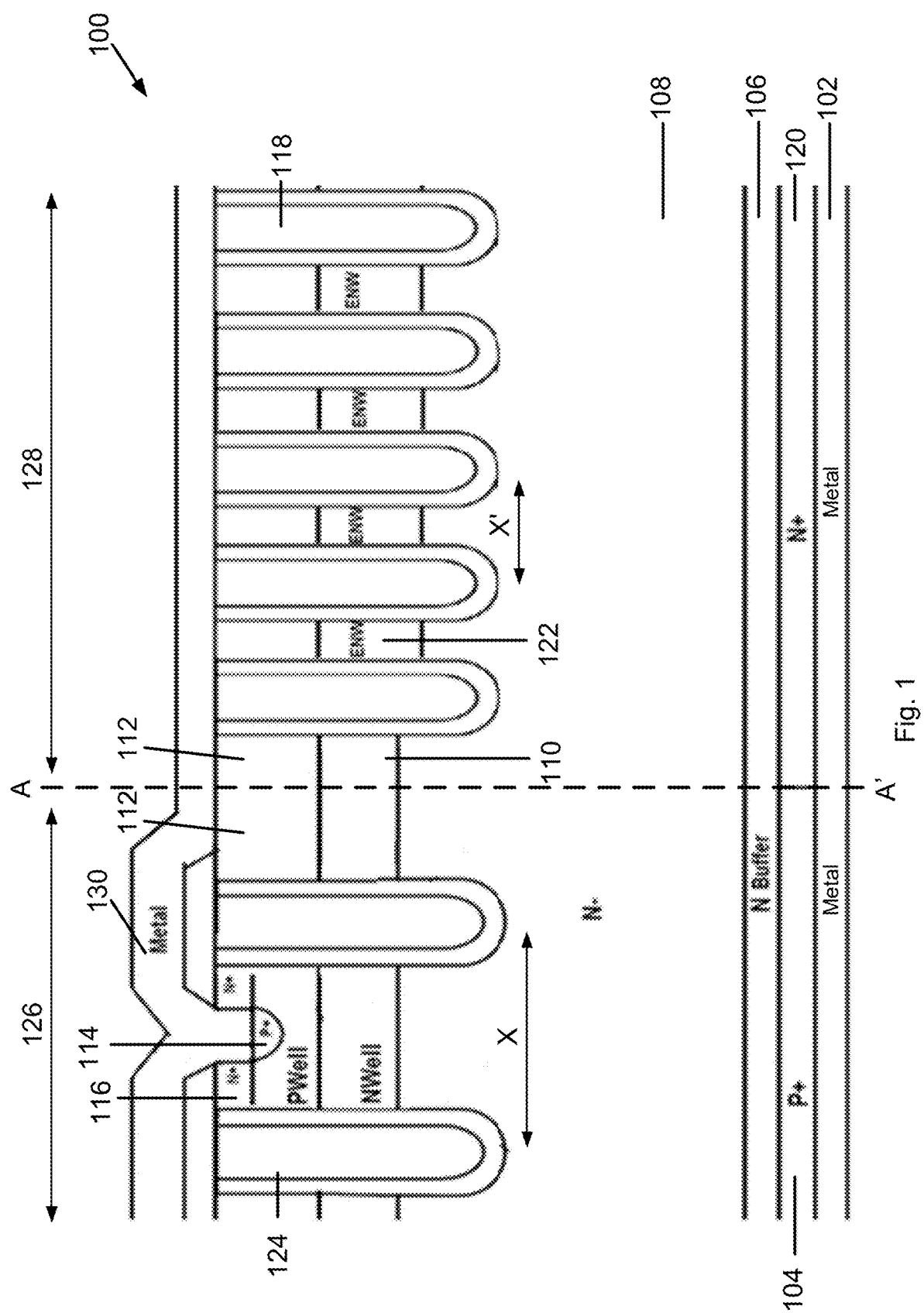
FIG. 1 shows a schematic cross-section of a semiconductor device, according to an embodiment of the disclosure.

FIG. 1 shows a schematic cross-section of a semiconductor device 100 according to an embodiment of the disclosure. The device is separated into two cross sections by a vertical cutline A-A'. The two cross sections may not be necessarily placed in the same plane, although are shown in the same plane in this embodiment. The area 126 on the left hand side of the vertical cutline is referred to as the first element portion of the device and operates as an IGBT. The area 128 on the right hand side of the cutline is referred to as the second element portion and operates as a diode. The IGBT area 126 and the diode area 128 are integrated in parallel on the same silicon chip.

In this embodiment, the device 100 comprises an n-type voltage sustaining region or n-base (or a drift region) 108 over a p+ collector layer 104 (in the IGBT area 126) and an n+ collector layer 120 (in the diode area 128). The collector p+ layer 104 is, for example, a p-type diffusion on the backside that supplies holes in the on-state for bipolar conduction. The collector n+ layer 120 is, for example, an n-type diffusion on the backside that supplies electrons in the on-state for bipolar conduction.

The collector layers 104, 120 are formed over and electrically connected to the collector terminal metal contact 102. An n-buffer region 106 is located between and parallel to the collector regions 104, 120 and the n-drift region 108. The n-base region 108, buffer region 106, and collector metal contact 102 extend across both the IGBT area 126 and the diode area 128.

Two active trenches 124 extend down into the n-base 108 from an upper surface of the device, within the IGBT area 126 of the device. The active trenches 124 act as a trench gate along which a MOS channel is formed in an on-state by application of a positive voltage. The active trenches 124 are separated from each other by a distance X. Within the n-base 108 and between and adjacent to the active trenches 124, there is provided a p-well or p-body (or a body region) 112. Within the p-base of p-body 112, an n+ contact region 116 of the emitter is formed.

In the embodiment of FIG. 1, an emitter metal contact 130 is formed which is laterally spaced from the active trenches 124. The emitter contact 130 is formed between the two active trenches 124, extending down below a surface of the active trenches 124. An emitter p+ contact layer (or the second contact region) 114 is formed above the p-base (p-well layer) 112. The p+ contact layer 114 is formed below the emitter contact 130. The emitter metal contact 130 is generally grounded in all modes of operation.

Underneath the p-base (p-well layer) 112, and in contact with both the p-base 112 and the n-base layer 108, there is an n-well layer 110 formed in the IGBT area 126. This n-well layer 110 acts as a charge storage (CS) layer.

Multiple auxiliary (or dummy) trenches 118 are formed in the diode area 128 and extend down into the n-base 108 from an upper surface of the device, within the diode area 128 of the device. The auxiliary trenches 118 in the diode area 128 are separated from each other by a distance X'.

Each trench 118, 124 includes vertical sidewalls and a bottom surface between the vertical sidewalls. The active and auxiliary trenches 118, 124 can be doped polysilicon trenches with an oxide region on the side walls. The active trench 124 can also be a dielectric filled trench with a gate metal electrode within the trench 124. The auxiliary trenches 118 are not active and are biased at ground potential. The separation X' between adjacent trenches 118 in the diode area 128 is less than the separation X between adjacent trenches 124 in the IGBT area 126. Therefore the number density of trenches within the diode area 128 is greater than the number density of trenches in the IGBT area 126. This increased trench cell density in the diode area allows control of anode injection of the diode.

In the diode area 128, underneath the p-well layer 112, an enhanced n-well layer 122 is formed. The enhanced n-well layer 112 has a higher doping concentration than the n-well 110 in the IGBT area 126. The increased trench cell density (the closeness of trenches) in the diode area 128 means that the doped n-well layer 122 in the diode side 128 of the device can enriched without degradation in breakdown performance. Therefore, the doping level within the n-well layer 122 under the diode p-anode 112 can be increased to levels higher than possible in the IGBT area 126 of the device. The combination of high trench density (or closer trenches) and enhanced n-well layer 122 in the diode side 128, enables anode injection optimisation of the diode (to achieve lower diode reverse recovery current (Irr), diode reverse recovery charge (Qrr) and diode reverse recovery energy (Erec)) without affecting the IGBT performance.

Figure 2:
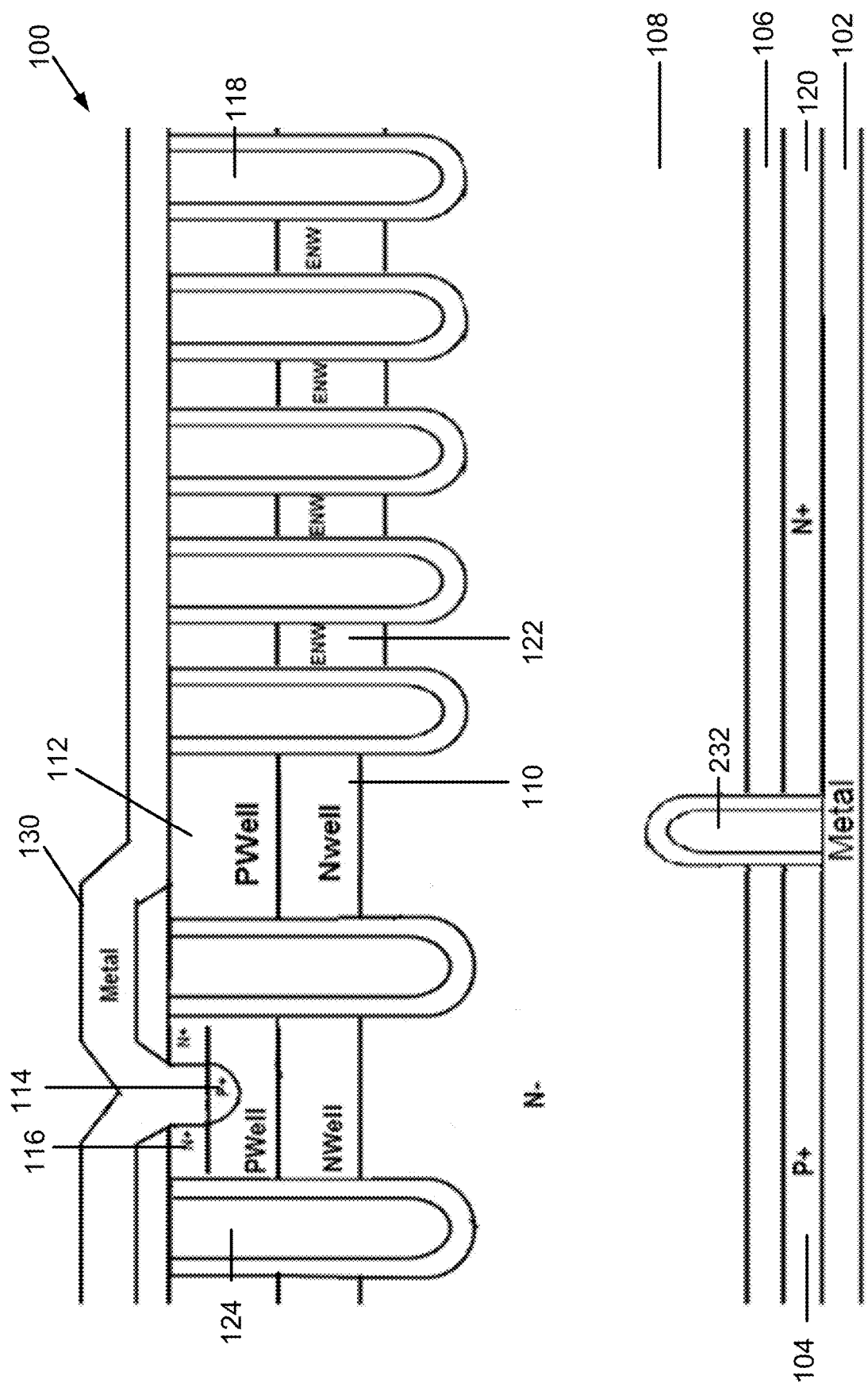
FIG. 2 shows a schematic cross-section of a semiconductor device having a trench on the backside of the device, according to an alternative embodiment of the disclosure.

FIG. 2 shows a schematic cross-section of a semiconductor device 100 having an additional trench 232 on the backside of the device 100, according to an alternative embodiment of the disclosure. In this embodiment, a deep trench 232 is formed on the collector terminal 102 side of the device and extends through both the p+ collector region 104 and the n+ collector region 120 to the drift region 108. The additional deep trench 232 may have a depth of 15 to 20 μm and is formed over the vertical cutline A-A' or the boundary between the two element portions of the device. Therefore the additional deep trench 232 is partially located within the diode area 128 and partly located within the IGBT area 126 of the device 100.

The additional deep trench 232 helps prevent snap-back in the IGBT characteristics by constraining electrons during IGBT conduction mode to flow only into the p+ collector region 104 in the back side of the device to prevent snap-back. Without the additional deep trench, electrons may flow into the diode anode and cause additional injection of holes from the diode, which can cause current crowding around the periphery of the IGBT area. This can create hot spots and degrade the IGBT reverse bias safe operating area (RB-SOA). Using an additional deep trench therefore improves the IGBT reverse bias safe operating area.

Figure 3:
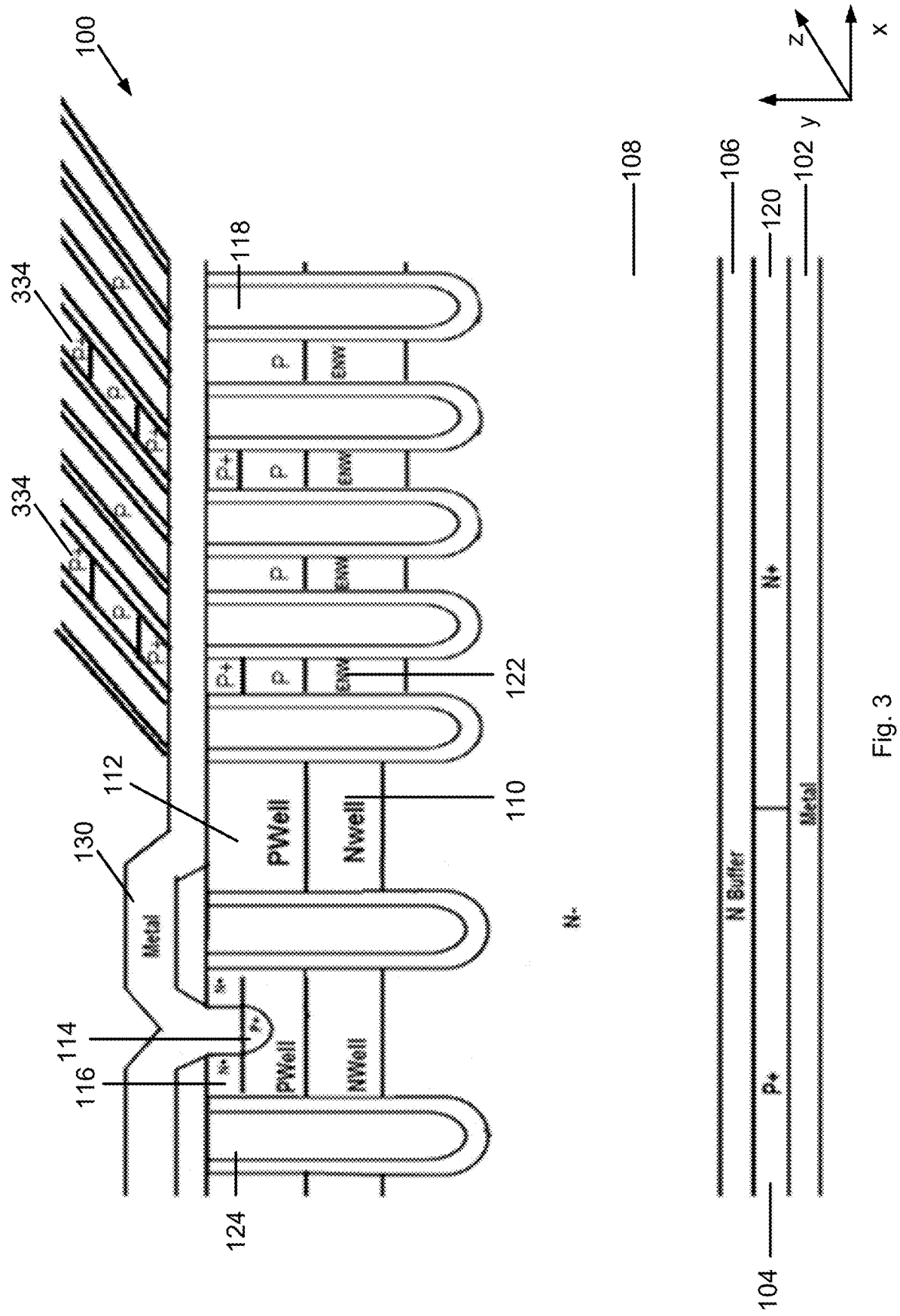
FIG. 3 shows a schematic cross-section of a semiconductor device having distributed p+ contact regions between adjacent trenches in a diode portion of the semiconductor device, according to an alternative embodiment of the disclosure.

FIG. 3 shows a schematic cross-section of a semiconductor device 100 having distributed p+ contact regions 334 between adjacent trenches 118 in a diode portion 128 of the semiconductor device 100, according to an alternative embodiment of the disclosure. The p+ contact regions (or third contact regions) 332 are located above the p-well 112 in the diode area 128 of the device 100. The p+ contact regions 332 are distributed between p-well regions 112, spaced from each other in the third dimension. The presence of high concentration n-well improves the diode reverse recovery performance (Erec/Irr) but at the expense of diode on-state conduction voltage drop (Vf). The p+ contact regions 332 between the trenches tailor the trade-off performance of Vf/Erec/Irr.

Figure 4:
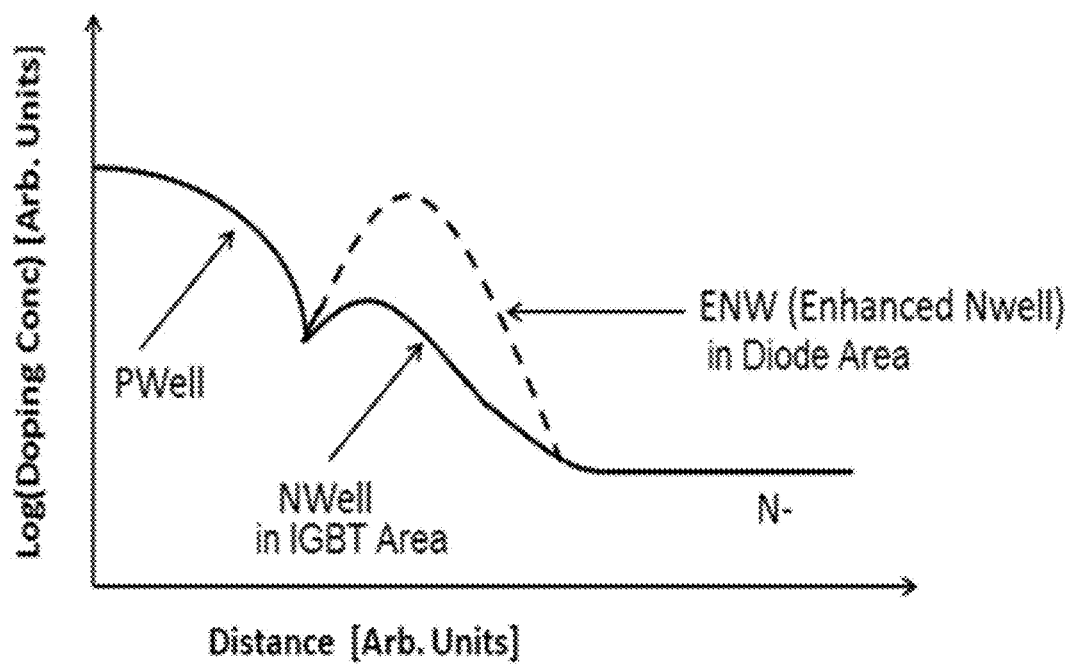
FIG. 4 shows doping profiles of p-well, n-well, and enhanced n-well regions of an example semiconductor device according to any embodiment of the disclosure.

FIG. 4 shows doping profiles of p-well, n-well, and enhanced n-well regions of an example semiconductor device according to any embodiment of the disclosure. This shows log of doping concentration against distance from a top surface of the device. This shows that the enhanced n-well region of the diode area has a higher doping concentration than the n-well region in the IGBT area of the device.

Figure 5:
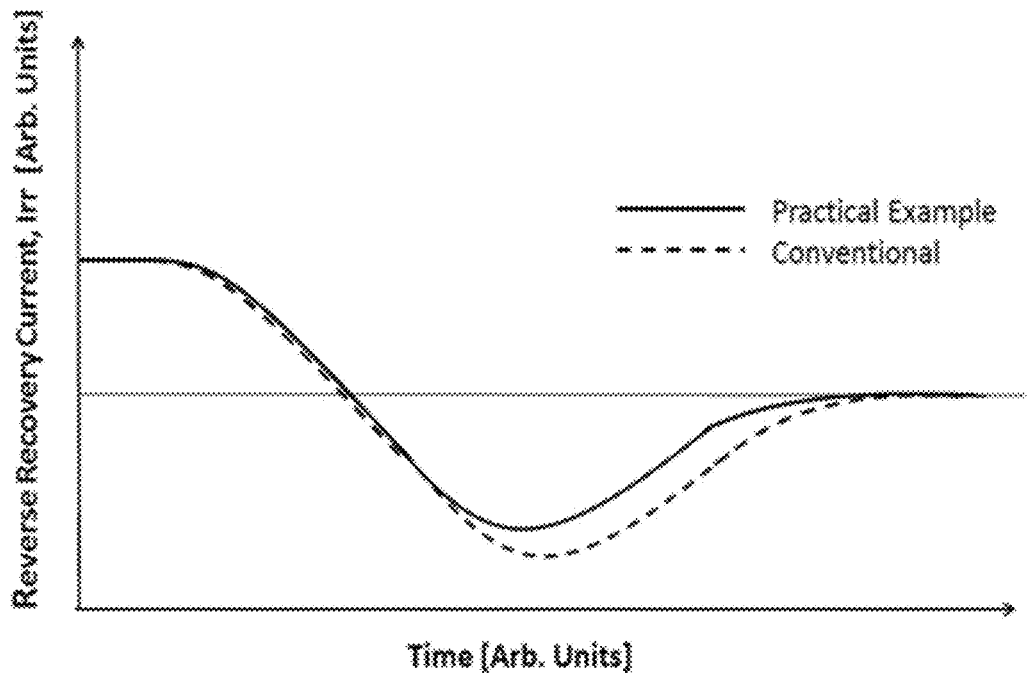
FIG. 5 shows reverse recovery performance of an example semiconductor device according to an embodiment of the disclosure.

FIG. 5 shows reverse recovery performance of an example semiconductor device according to an embodiment of the disclosure. This shows that with this semiconductor device of the disclosure, the reverse recovery current peak is reduced, which is an indication of reduced Qrr and results in reduced Erec compared with a conventional device.

FIGS. 6(a) to 6(e) show steps in an example manufacturing method according to an embodiment of the disclosure. Whilst this example shows two trenches, it could be used to manufacture more than two trenches, and does not have to be trenches that are adjacent to each other. The method can be used to manufacture trenches simultaneously.

Figure 6:
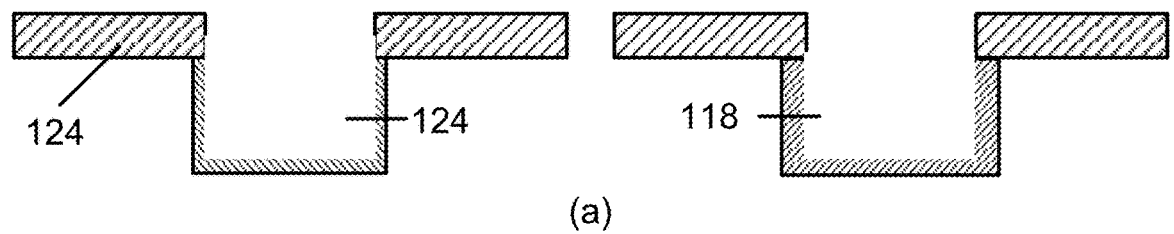
FIGS. 6(*a*) to 6(*e*) show steps in an example manufacturing method according to an embodiment of the disclosure.
Figure 6:
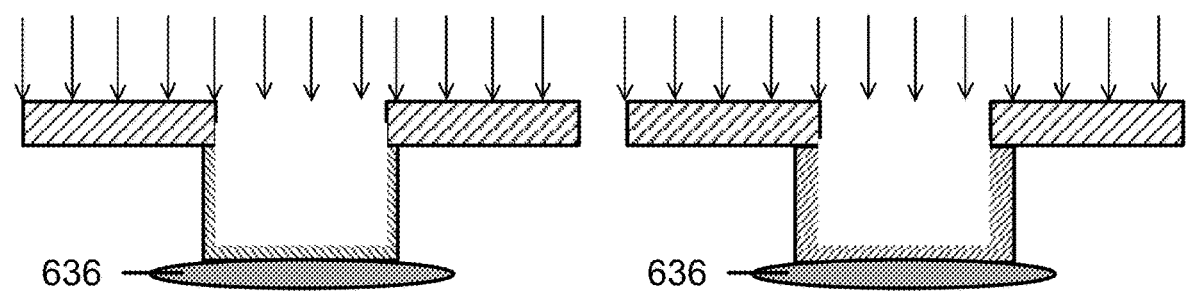
Figure 6:
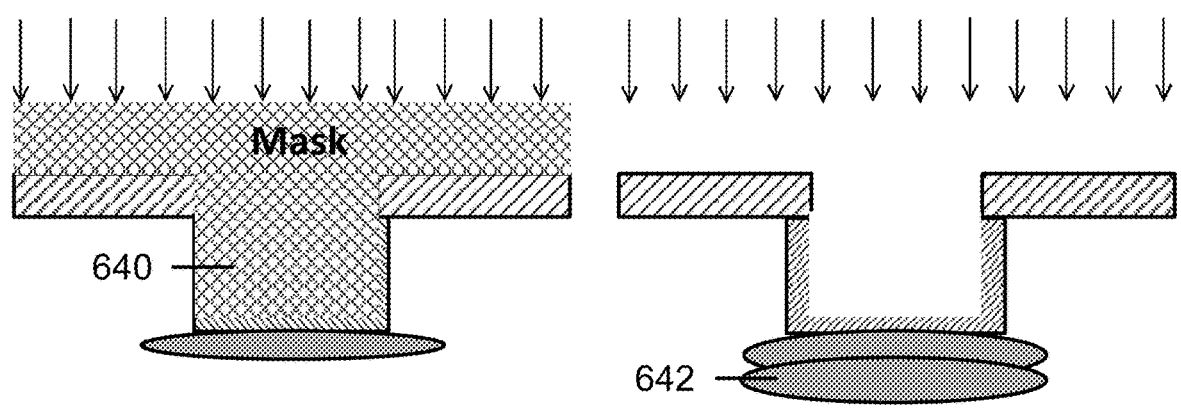
Figure 6:
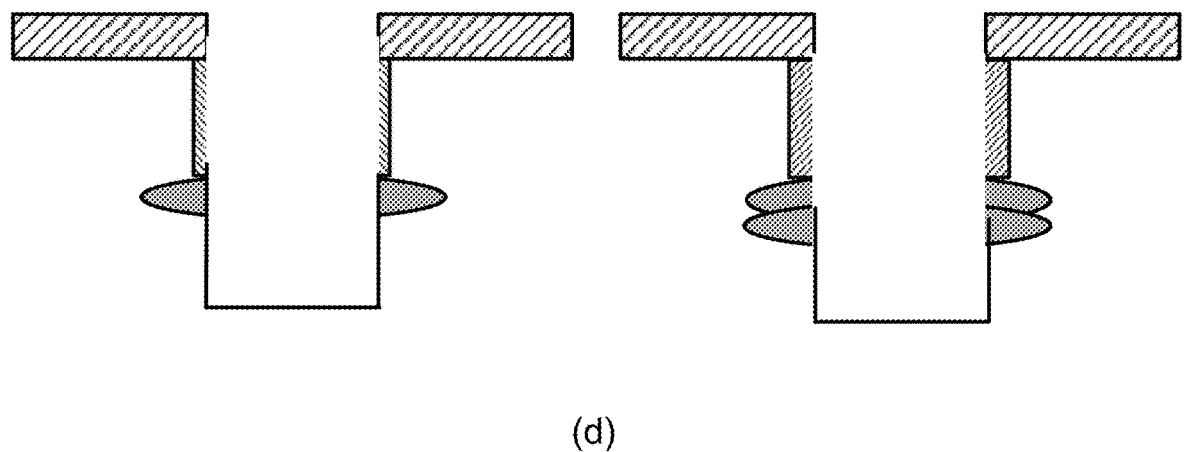
Figure 6:
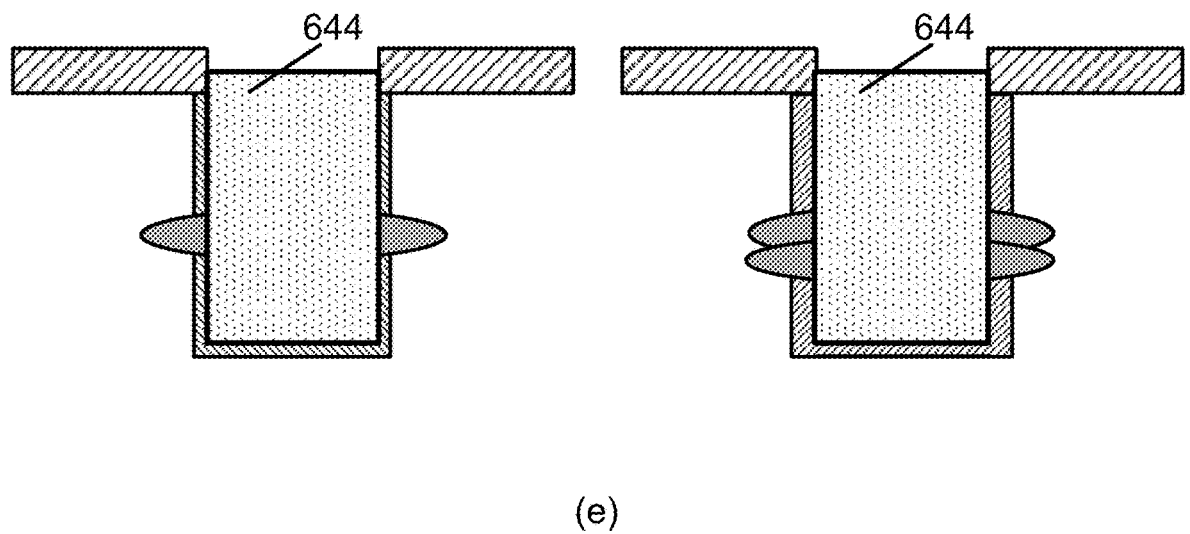

FIG. 6(a) illustrates the first step of manufacturing a trench having an n-well layer and a trench having an enhanced n-well layer, which is as follows:

(a) Step 1

An etching process is performed to form two trenches 124, 118 laterally spaced from each other. An insulation layer (such as oxide) 124 is deposited on the trench bottom and sidewalls and in the mesa region between trenches.

FIG. 6(b) illustrates the second step of manufacturing a trench having an n-well layer and a trench having an enhanced n-well layer, which is as follows:

(b) Step 2

A first n-doped region of a high doping concentration 636 is deposited or implanted towards the bottom of each trench 118, 124.

FIG. 6(c) illustrates the third step of manufacturing a trench having an n-well layer and a trench having an enhanced n-well layer, which is as follows:

(c) Step 3

A mask 640 is provided in and over the trench 124 of the IGBT area of the device.

A second n-doped region of a high doping concentration 642 is then deposited or implanted in the trench 118 of the diode area. The mask in the trench 124 of the IGBT area prevents a second n-doped region of a high doping concentration from being formed in the trench of the IGBT area.

FIG. 6(d) illustrates the fourth step of manufacturing a trench having an n-well layer and a trench having an enhanced n-well layer, which is as follows:

(d) Step 4

The mask is removed.

A further etching process is performed to etch and extend both trenches 118, 124 to a greater depth. The etch process may be a silicon etch using RIE (reactive ion etching).

FIG. 6(e) illustrates the fifth step of manufacturing a trench having an n-well layer and a trench having an enhanced n-well layer, which is as follows:

(e) Step 5

An oxide layer is grown or deposited on the trench sidewalls in the regions of the trench etched in Step 4.

A filling material (such as doped polysilicon) 644 is deposited in both trenches 118, 124 and a planarization etch performed.

The method may also include a temperature treatment between 900-1100° C. (typically in nitrogen) to anneal out any damage to silicon caused by the high energy implantation of phosphorus (the n-well) as well as diffusion to desired depths. A further anneal step may be needed after the implantation of boron (the p-well) for the diode p-anode regions. Common or separate metallization layers may be used for both the IGBT and diode regions on the front and back sides of the wafer The skilled person will understand that in the preceding description and appended claims, positional terms such as 'above', 'overlap', 'under', 'lateral', 'vertical', etc. are made with reference to conceptual illustrations of a semiconductor device, such as those showing standard cross-sectional perspectives and those shown in the appended drawings. These terms are used for ease of reference but are not intended to be of limiting nature. These terms are therefore to be understood as referring to a transistor when in an orientation as shown in the accompanying drawings.

It will be appreciated that all doping polarities mentioned above could be reversed, the resulting devices still being in accordance with the present invention. It will be appreciated that the emitter, collector and trench gate (active trench) could be arranged to be out-of-plane or to be differently aligned so that the direction of the carriers is not exactly as described above, the resulting devices still being in accordance with the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A semiconductor device comprising:
    a first element portion formed on a substrate, the first element portion being an operating region of an insulated gate bipolar transistor (IGBT); and
    a second element portion formed on the substrate, the second element portion being an operating region of a diode,
    wherein the first element portion comprises:
        a first collector region of a second conductivity type;
        a drift region of a first conductivity type located over the first collector region, and formed by the semiconductor substrate;
        a first body region of a first conductivity type located over the drift region;
        a second body region of a second conductivity type located over the drift region;
        at least one first contact region of a first conductivity type located above the second body region and having a higher doping concentration compared to the first body region;
        at least one second contact region of a second conductivity type located laterally adjacent to the at least one first contact region, the at least one second contact region having a higher doping concentration than the second body region;
        a first plurality of trenches extending from a surface through the second body region of a second conductivity type into the drift region wherein the at least one first contact region adjoins at least one of the plurality of trenches so that, in use, a channel region is formed along said at least one trench of the first plurality of trenches and within the body region of a second conductivity type, and wherein a first trench of the first plurality of trenches is laterally spaced from a second trench of the first plurality of trenches by a first distance; and
    wherein the second element portion comprises:
        a second collector region of a first conductivity type;
        the drift region of a first conductivity type located over the second collector region;
        a third body region of a second conductivity type located over the drift region;
        a second plurality of trenches extending from a surface through the third body region into the drift region, wherein a first trench of the second plurality of trenches is laterally spaced from a second trench of the second plurality of trenches by a second distance, and wherein the first distance is larger than the second distance;
        a fourth body region of a first conductivity type located over the drift region, wherein the fourth body region is located between the first trench of the second plurality of trenches and the second trench of the second plurality of trenches, and wherein the fourth body region has a higher doping concentration than the first body region; and
    wherein the semiconductor device further comprises:
        a first terminal contact, wherein the first terminal contact is electrically connected to the at least one first contact region of a first conductivity type and the body region of a second conductivity type; and
        a second terminal contact, wherein the second terminal contact is electrically connected to the first collector region and the second collector region.

2. A semiconductor device according to claim 1, wherein the first plurality of trenches occupy a first fraction of the area of the first element portion, and wherein the second plurality of trenches occupy a second fraction of the area of the second element portion, and wherein the second fraction is greater than the first fraction.

3. A semiconductor device according to claim 1, wherein the second plurality of trenches occupy between 50% and 75% of the area of the second element portion.

4. A semiconductor device according to claim 1, wherein the number density of trenches within the first element portion is given by m, and wherein the number density of trenches within the second element portion is given by n, and wherein m is substantially smaller than n.

5. A semiconductor device according to claim 1, wherein the first distance is between 2 μm and 4 μm, and wherein the second distance is less than 2 μm.

6. A semiconductor device according to claim 1, wherein the doping concentration of the fourth body region is greater than $1\times10^{17}$ cm$^{-3}$.

7. A semiconductor device according to claim 1, wherein the semiconductor device further comprises one or more additional trenches extending from a surface through the first and second collector regions to the drift region.

8. A semiconductor device according to claim 7, wherein the one or more additional trenches are located such that the one or more additional trenches are located partially within the first element portion and partially within the second element portion.

9. A semiconductor device according to claim 7, wherein the one or more additional trenches have a depth of between 15 μm and 20 μm.

10. A semiconductor device according to claim 1, wherein the second element portion comprises at least one third contact region of a second conductivity type (p+), the at least one third contact region having a higher doping concentration than the third body region, and
wherein the third contact region is located between the first trench of the second plurality of trenches and the second trench of the second plurality of trenches.

11. A semiconductor device according to claim 10, wherein the first trench of the second plurality of trenches and the second trench of the second plurality of trenches are laterally spaced in a first dimension, and
wherein, in use, current flows in the second element portion of the device in a second dimension substantially transverse to the first dimension, and
wherein the first trench of the second plurality of trenches and the second trench of the second plurality of trenches each extend in a third dimension of the device.

12. A semiconductor device according to claim 11, wherein the third contact region is formed in the third dimension of the device.

13. A semiconductor device according to claim 12, wherein the third body region comprises a plurality of portions in the third dimension, wherein the portions are shaped such that at least a space is formed between two portions.

14. A semiconductor device according to claim 13, wherein the third contact region comprises a plurality of segments in the third dimension, each segment being located within the space formed between two portions of the third body region.

15. A method of manufacturing a semiconductor device comprising:
forming a first element portion formed on a substrate, the first element portion being an operating region of an insulated gate bipolar transistor (IGBT); and
forming a second element portion formed on the substrate, the second element portion being an operating region of a diode,
wherein forming the first element portion comprises:
forming a first collector region of a second conductivity type;
forming a drift region of a first conductivity type located over the first collector region, and formed by the semiconductor substrate;
forming a first body region of a first conductivity type located over the drift region;
forming a second body region of a second conductivity type located over the drift region;
forming at least one first contact region of a first conductivity type located above the second body region and having a higher doping concentration compared to the first body region;
forming at least one second contact region of a second conductivity type located laterally adjacent to the at least one first contact region, the at least one second contact region having a higher doping concentration than the second body region;
forming a first plurality of trenches extending from a surface through the second body region of a second conductivity type into the drift region wherein the at least one first contact region adjoins at least one of the plurality of trenches so that, in use, a channel region is formed along said at least one trench of the first plurality of trenches and within the body region of a second conductivity type, and wherein a first trench of the first plurality of trenches is laterally spaced from a second trench of the first plurality of trenches by a first distance (adjacent trenches); and
wherein forming the second element portion comprises:
forming a second collector region of a first conductivity type;
forming the drift region of a first conductivity type located over the second collector region;
forming a third body region of a second conductivity type located over the drift region;
forming a second plurality of trenches extending from a surface through the third body region into the drift region, wherein a first trench of the second plurality of trenches is laterally spaced from a second trench of the second plurality of trenches by a second distance, and wherein the first distance is larger than the second distance;
forming a fourth body region of a first conductivity type located over the drift region, wherein the fourth body region is located between the first trench of the second plurality of trenches and the second trench of the second plurality of trenches, and wherein the fourth body region has a higher doping concentration than the first body region; and
wherein the method further comprises:
forming a first terminal contact, wherein the first terminal contact is electrically connected to the at least one first contact region of a first conductivity type and the body region of a second conductivity type; and
forming a second terminal contact, wherein the second terminal contact is electrically connected to the first collector region and the second collector region.

16. A method of manufacturing a semiconductor device having a first element portion formed on a substrate, the first element portion being an operating region of an insulated gate bipolar transistor (IGBT); and
a second element portion formed on the substrate, the second element portion being an operating region of a diode,
wherein each of the first element portion and the second element portion comprise a body region of a first conductivity type and at least one trench extending from a surface through the first body region, and
wherein the body region of a first conductivity type of the second element portion has a higher doping concentration than the body region of a first conductivity type of the first element portion and is located between a first trench of the at least one trench of the second element portion and a second trench of the at least one trench of the second element portion, and wherein the method comprises:
  performing an etching process to the trenches laterally spaced from one another;
  depositing a highly doped region of a first conductivity type in a lower portion of each of the trenches;
  providing a mask over the trench of the first element portion;
  depositing an additional highly doped region of a first conductivity type in a lower portion of trench of the second element portion;
  removing the mask;
  performing an additional etching process to extend the depth of the trenches.

17. A method according to claim 16, wherein the method further comprises depositing a filling material within the trenches.

* * * * *